(12) United States Patent
Gillig (10) Patent No.: US 7,162,688 B1
(45) Date of Patent: *Jan. 9, 2007

(54) METHOD FOR AUTOMATED GENERATION AND ASSEMBLY OF SPECIFICATIONS DOCUMENTS IN CADD ENVIRONMENTS

(76) Inventor: Robert B Gillig, 314 Beacon St., No. 2, Somerville, MA (US) 02143

( * ) Notice: Subject to any disclaimer, the term of this patent is extended or adjusted under 35 U.S.C. 154(b) by 0 days.

This patent is subject to a terminal disclaimer.

(21) Appl. No.: 11/160,955

(22) Filed: Jul. 18, 2005

Related U.S. Application Data (63) Continuation-in-part of application No. 09/626,803, filed on Jul. 27, 2000, now Pat. No. 6,993,708.

(51) Int. Cl.
*G06F 17/00* (2006.01)

(52) U.S. Cl. ...................... 715/502; 715/511

(58) Field of Classification Search ................ 715/500, 715/502, 511, 515, 526, 540
See application file for complete search history.

(56) References Cited

U.S. PATENT DOCUMENTS

| | | | | | |
|---|---|---|---|---|---|
| 4,496,989 | A | * | 1/1985 | Hirosawa ................... | 358/296 |
| 4,641,197 | A | * | 2/1987 | Miyagi ...................... | 358/450 |
| 4,882,692 | A | * | 11/1989 | Saxton et al. ............... | 345/661 |
| 5,197,120 | A | * | 3/1993 | Saxton et al. ............... | 345/661 |
| 5,241,472 | A | * | 8/1993 | Gur et al. ................... | 382/128 |
| 5,249,137 | A | * | 9/1993 | Wilson et al. ................. | 703/2 |
| 5,341,469 | A | * | 8/1994 | Rossberg et al. ........... | 715/514 |
| 5,410,647 | A | * | 4/1995 | Peaslee et al. .............. | 345/467 |
| 5,428,727 | A | * | 6/1995 | Kurosu et al. .............. | 715/502 |
| 5,437,008 | A | * | 7/1995 | Gay et al. ................... | 715/502 |
| 5,444,843 | A | * | 8/1995 | Nilsson et al. .............. | 715/502 |
| 5,745,907 | A | * | 4/1998 | Yamamoto .................. | 715/502 |
| 5,806,079 | A | * | 9/1998 | Rivette et al. .............. | 715/512 |
| 5,813,018 | A | * | 9/1998 | Kaji et al. .................. | 715/502 |
| 6,134,338 | A | * | 10/2000 | Solberg et al. ............. | 382/113 |
| 6,236,409 | B1 | * | 5/2001 | Hartman .................... | 345/629 |
| 6,389,434 | B1 | * | 5/2002 | Rivette et al. .............. | 715/512 |
| 6,877,137 | B1 | * | 4/2005 | Rivette et al. .............. | 715/512 |
| 2001/0052908 | A1 | * | 12/2001 | Hartman .................... | 345/630 |
| 2002/0016725 | A1 | * | 2/2002 | Eichstaedt et al. ............ | 705/7 |
| 2005/0160357 | A1 | * | 7/2005 | Rivette et al. .............. | 715/512 |

(Continued)

OTHER PUBLICATIONS

Prabhu et al., Intelligent Interpretation of CADD Drawings (abstract), Feb. 1, 1999, Computer-aided Manufacturing Laboratory, Mechanical Engineering Department, Indian Institute of Technology, Computers & Graphics vol. 23, Issue 1, pp. 1-2.*

*Primary Examiner*—Stephen Hong
*Assistant Examiner*—Gregory J. Vaughn
(74) *Attorney, Agent, or Firm*—Mark P. White (57) ABSTRACT

A method for automating the production of corroborative Textual Documentation for CADD-based Design and Engineering disciplines includes a computer-based system with Linking Software. The generation of CADD drawings creates an electronic database of unique graphical entities. The method creates subsequent drawings which may include some or all of the Drawing Entities stored in the database. An electronic link is effected between the Drawing Entities and the associated Specifications document text. Unique Drawing Entities within a CADD drawing are tagged with a unique identifier. Simultaneously, Specifications Text Blocks, each one comprising a subset of the complete Specifications Document, are identified. Each Drawing Entity in the database is uniquely linked to one or more Specifications Text Blocks. Subsequent use of the tagged Drawing Entity allows for the automatic re-use of the associated Specifications Text Block.

21 Claims, 7 Drawing Sheets

U.S. PATENT DOCUMENTS

2005/0171823 A1*  8/2005  Eichstaedt et al. .............. 705/7
2005/0172260 A1*  8/2005  Eichstaedt et al. ........... 717/104
2005/0228703 A1*  10/2005  Eichstaedt et al. .............. 705/7
2006/0004472 A1*  1/2006  Eichstaedt et al. ............ 700/96

* cited by examiner

FIG. 6 iNOTES (tm)

intelliNOTES: Build Specification Document File...

| 1 Front of Document | 2 Division 1 | | 4 Back of Document | Reporting... |

DIVISIONS 2-16 Files to be assigned to Document:
03300   4" Conc. slab w/ Welded Wire Fabric reinforcing
04810   15" stl. bar joists @ 24" oc-4" min. bearing on conc. block
04820   Galv. Masonry Ties @ 24" oc vert. (typ.)
09260   1/2" Gypsum Wall Board on 1 1/2" stl. furring
09511   24" x 24" acoustic tile ceiling
09980   3/4" x 4" cont. Wood base- paint View Note Info...

☑ Show File Names only
Status

What do I do Now?

Cancel    ?    Create Specifications File...    Done

FIG. 7

METHOD FOR AUTOMATED GENERATION AND ASSEMBLY OF SPECIFICATIONS DOCUMENTS IN CADD ENVIRONMENTS

PROSECUTION HISTORY

This application claims priority based on U.S. application Ser. No. 09/626,803, filed on Jul. 27, 2000 now U.S. Pat. No. 6,993,708 by the same inventor as the present application.

BACKGROUND OF INVENTION

In the creation of Architectural, Engineering, or other design-services based fabrications, it is typically required that both graphical and textual descriptions of the final product be produced. Graphical descriptions ('Drawings') are typically produced in Computer-Aided Design and Drafting ('CADD') software programs such as AutoCAD, and textual descriptions ('Specifications') are produced in text processing programs such as Microsoft Word. Drawings and Specifications are complimentary—Drawings typically delineate such information as size, shape, volume, material types, and details of fabrication whereas Specifications typically describe acceptable methods of assembly and standards of quality for the fabrication process as a whole or within its constituent parts. In general terms, the Drawings component can be seen as embodying issues of quantity, and the Specifications component can be seen as responding to issues of quality. The two are combined in what is commonly known as the Project Manual. The activity that entails the preparation of the Project Manual for compensation is known as a Project. A complete Project Manual establishes an unambiguous understanding of the nature and scope of the Project, allowing all parties to the Project to come together to establish specific pricing, fabrication timetables, and expectations of quantity and quality agreeable to all. Furthermore, a complete Project Manual establishes a legal standard by which performance under the Contract for Fabrication can be adjudicated in the event of any disagreement between parties to the Project during or upon completion of the fabrication.

It is commonplace that Drawings are produced first. Drawings consist of a series of lines arranged in such a way as to illustrate a fabrication in whole or in part, together with text notations ('Drawing Notes') identifying in writing each material, part, or assembly to ensure an accurate interpretation of the graphical illustrations by the fabricator. It is commonplace that Drawings are prepared by Interns and Junior Designers under the supervision of a Partner or Senior Designer.

After the production of the Drawings is completed or well under way, Specifications are produced. In spite of the critical role Specifications play in the successful completion of a Project, Interns and Junior Designers typically are not skilled in Specifications preparation, often by their own choice, as it is commonly seen as unglamorous drudgery. Specifications are derived manually, most often by professionals specializing in this activity. Specifications may be produced 'in-house' but are often produced by external consultants who have no specific knowledge of the Project before receiving the Drawings. Specifications are produced through a laborious process of cataloguing each Drawing Entity in the Drawings and creating a customized Specification text to be associated with it. 'Drawing Entity' here refers to any Notation, Item, Material, Part, or Assembly that can be identified as logically discreet or unique within the context of a given Project. It is the basic unit or discreet grouping of units of a document created by a CADD system. A Drawing Entity may be electronically stored in any manner allowing for accurate retrieval, including in Operating System directories or structured databases. Once created, Drawing Entities are often reused in many Projects in a particular office environment, this redundancy being seen as beneficial to productivity. New Drawings are created through new combinations of these basic elements.

The process of Specifications development is susceptible to human error and inaccuracy, with potential consequences to the Project and all parties associated with it of delays, cost overruns, and/or litigation. Specifiers must research each particular material, system or technology referenced in the Drawings, sometimes exhaustively, collate this information, and produce a written document in Industry-standard format (which varies by industry) comprising the complete Specifications Document for the Project in question. Specifications Documents typically run into the many hundreds of pages, and for large projects, well over a thousand pages. The process of creating Specifications Documents can be tedious and time-consuming and on a Project-to-Project basis can be highly redundant, but since each Project is at least slightly different, and since those differences cannot be assumed to be self-evident, it is incumbent upon the Specifier to essentially 'start-from-scratch' with each new Project. Much Specifications text can be reused Project-to-Project, but not without completely rereading, editing and modifying as required, re-collating, adding new Specifications text as required by the addition of new Drawing Entities in the Drawings, and subsequent reassembly of all constituent parts to form a new Specifications Document.

The current Invention provides a software link between CADD software used for producing Drawings and Word Processing software used for producing Specifications. This software link 'tags' or otherwise identifies all unique Drawing Entities in all Drawings comprising a Project. This Linking Software establishes and maintains a database that associates, on a one-to-one basis, each unique Drawing Entity with a pre-prepared or concurrently prepared block of Specifications Text. In so doing, collating all Drawing Entities in a Project, while ignoring duplicates, allows for the immediate and automatic collation and assembly of a complete Specifications Document. This benefit is accrued incrementally over time, and the initial act of Specifications text creation may be equally as tedious and time-consuming as in conventional methods. However, because each specific Specifications Text Block is associated with a specific Drawing Entity that is in turn associated with it regardless of Project context, reuse of that Drawing Entity in a subsequent Project realizes the aforementioned efficiency with each reuse. Over time, a database of Drawing Entities can be accumulated that may suffice for virtually all Projects, and tools imbedded in the current invention allowing for the easy addition of unique links between new Drawing Entities and new Specifications Text Blocks will eventually allow for the automatic generation and assembly of complete Specifications Documents without review by Specifications professionals.

The software implementing this Link may also provide other necessary functions producing corollary benefits, such as:

A database of Drawing Entities must be created and maintained, and be accessible to all persons needing to modify any or all Drawings associated with a Project. Ready accessibility of this Drawing Entities database allows for automatic insertion of previously defined Drawing Entities into the CADD Drawing, which saves time and increases accuracy as compared with reconstructing Drawing Entities manually, as is typical. The Drawing Entities database can be centrally maintained and updated within an organization to ensure the greatest possible organization-wide standardization and accuracy across all Projects and all Persons authorized to modify any or all Projects.

Updating a Drawing Entity in the central database causes every occurrence of that Entity to be updated throughout a Project or multiple Projects, which is otherwise a time-consuming task prone to human error.

It is not necessary for every imaginable Drawing Entity to be referenced in the database for great efficiencies to be realized. Even if only 90% or so of a new Project is anticipated by the current state of the database, that implies that only 10% of the Project's necessary Drawing Entities need to be constructed from scratch, and accuracy will be much greater since 90% of the new Project's Drawing Entities will already be 'pre-approved'. Furthermore, upon completion of the new Project, the Database will have expanded by 10% and it can be assumed that in the aggregate, ensuing Projects will have an ever greater efficiency ratio than those previous, tending towards 100% for some, if not all, Projects.

SUMMARY OF THE INVENTION

It is a general object of the current invention to provide a system to generate and maintain a database of CADD Project documentation which can be generally used in a variety of Projects throughout a CADD-based Design or Engineering firm. It is a specific object of the invention to provide such a system in a modular form, with reusable Specifications Text Blocks and reusable Drawing Entities.

In accordance with one aspect of the invention a computer-software-based method for generating and maintaining Project textual documentation includes the software-implemented step of appending information to discrete electronically generated Drawing Entities for purposes of establishing an electronic link between said Drawing Entities and text in a first project.

In accordance with a second aspect of the invention a Drawing Entity contained in a CADD file is identified.

In accordance with a third aspect of the invention a grouping of text in a text block file is identified.

In accordance with a fourth aspect of the invention Linking Information between said Drawing Entity and said text is created.

In accordance with a fifth aspect of the invention a multiplicity of CADD files is scanned, each file containing a number of new Drawing Entities.

In accordance with a sixth aspect of the invention the previous steps are repeated for the new Drawing Entities.

In accordance with a seventh aspect of the invention all linking information is associated with the corresponding Drawing Entity or grouping of text.

In accordance with an eighth aspect of the invention each Drawing Entity, corresponding text, and associated linking information are stored together.

In accordance with a ninth aspect of the invention a printed Project Specifications Document comprising all text associated with said Drawing Entities is printed.

In accordance with a tenth aspect of the invention the previous steps for Drawing Entities not yet linked to text in a next project are repeated.

In accordance with an eleventh aspect of the invention a Project Database is created from the stored Drawing Entities, corresponding text, and associated linking information combined with the Drawing Entities, corresponding text, and associated linking information of the next project.

In accordance with a twelfth aspect of the invention a Project Database is identified from the stored Drawing Entities, corresponding text, and associated linking information combined with the Drawing Entities, corresponding text, and associated linking information of the next project.

In accordance with a thirteenth aspect of the invention the text block file further contains one or more word processor files.

In accordance with a fourteenth aspect of the invention the text block file further contains one or more database files.

In accordance with a fifteenth aspect of the invention the text block file includes one or more spreadsheet files.

In accordance with a sixteenth aspect of the invention the text block file includes one or more electronic means of storing an aggregate of discreet groupings of text.

In accordance with a seventeenth aspect of the invention it includes searching the Project Database for text blocks linked to each Drawing Entity identified, and, if present, using said links in the next project.

In accordance with a final aspect of the invention the Project Database is in the form of either a centralized, decentralized or distributed data storage format. This format is one of the several industry standard database formats.

BRIEF DESCRIPTION OF THE DRAWINGS

These, and further features of the invention, may be better understood with reference to the accompanying specification and drawings depicting the preferred embodiment, in which.

DETAILED DESCRIPTION OF PREFERRED EMBODIMENTS

Within this application, the following definitions will be used:

Drawing Entity: The basic unit of a document created by a CADD system.

Specification Text Blocks: Discreet blocks of corroborative Textual documentation capable of being associated with a unique Drawing Entity.

Specifications Document: the aggregate of a user-specified subset of Specifications Text Blocks Legacy Specifications Document: Specifications documents previously created and still on file, available as a resource in the creation of new Specifications documents for new Projects.

Legacy CADD Drawings: CADD Drawings previously created and still on file, available as a resource in the creation of new CADD Drawings for new Projects.

Project Database: The database used in a current Project, containing the Drawing Entities and Specifications Text Blocks for the current Project, and the links between unique Drawing Entities and the associated Specifications Text Blocks.

Linking Software: The software which is used in the preferred embodiment to implement the current invention.

Architectural Drawing Notes A type of Drawing Entity consisting of text. (also referred to as 'Drawing Notes')

General Concept of Operation

The current invention provides a system allowing for the automated assembly of Specifications Documents for Design and Engineering disciplines utilizing computer hardware and software as a primary method of document generation. The system includes a general purpose computer, with input and output devices attached. The software running on the computer system provides implementation by means of Linking Software that assists in generating and maintaining a database of Specifications Text Blocks which reside on the computer mass storage.

As alternatives to stand-alone computer implementation, the system may also be implemented on local or remote computer, or data communications networks of computers, including the Internet. The documents produced by this system are output in various forms, including hard-copy printouts and electronic publishing, both local and remote.

One of the main functions of the Linking Software is to establish and maintain an electronic link between each stored Drawing Entity of the set of Drawing Entities in the database, and an associated Specifications Text Block.

Text blocks can be generated and stored in a wide variety of ways. These include word processors, database files systems, spreadsheet systems, and other general means of storage as aggregates of discreet groupings of text. Thus, text blocks may be stored as word processor files, spread sheet files, database files, or other aggregates of discreet text groupings.

In accordance with the current invention, Specifications Text Blocks can be newly generated or cut-and-pasted from Legacy Specifications Documents and added to the Project Database. Saved Specifications Text Blocks are organized within this database by the Linking Software to allow for accurate and immediate retrieval of each unique Specifications Text Block when requested by the Linking Software.

Drawing Entities can be newly generated in CADD software or extracted from Legacy CADD Drawings and saved as individual files to disk or added to the Project Database, depending upon the type and nature of the Drawing Entity. In either case, each Drawing Entity is assigned a unique identifying tag by the Linking Software before being stored. This tag may store a variety of items of information about the Drawing Entity and its environment, but necessarily (at a minimum) stores retrieval information for the associated Specifications Text Block contained in the Project Database and information allowing hierarchical assembly of all referenced Specifications Text Blocks at the end of the Project.

The Linking Software allows the user to freely establish the hierarchy of assembly of all referenced Specifications Text Blocks according to a convention defined by the user, employing standard conventions that exist specific to the user's Design or Engineering discipline, or using a custom convention created by the user.

Accordingly, the Linking Software maintains a constant watch over the act of drawing creation in the CADD software and when the creation of a unique Drawing Entity is detected, the Linking Software prompts the user to identify the Specifications Text Block in the current database that is to be associated with the Drawing Entity. Alternatively, if no such Specifications Text Block currently exists, the Linking Software opens a text processing module that allows the user to create a new Specifications Text Block or to cut-and-paste from Legacy Specifications Documents. When the Specifications Text Block is identified, or created and saved, the Linking Software permanently tags the Drawing Entity with an invisible reference, or link, to the Specifications Text Block in the Project database maintained by the Linking Software, and the Drawing Entity is stored.

In the event that a Drawing Entity is modified or edited in the CADD software, the Linking Software detects that modification and prompts the user to modify the associated Specifications Text Block accordingly, as required. If the Specifications Text Block needs to be modified, the Linking Software references the Drawing Entity tag to determine the location of the associated Specifications Text Block, locates the indicated Specifications Text Block in the database, opens a text processing module and loads the indicated Specifications Text Block for editing. When the user has completed the necessary editing, the newly modified Specifications Text Block is saved and the Project Database is updated by the Linking Software to reflect the change.

Reuse in subsequent Projects of a Drawing Entity that has been previously tagged allows for the automatic inclusion of the associated Specifications Text Block into the Specifications Document for the new project, without editing or review, and ensuring 'pre-approved' accuracy of that portion of the completed new Specifications Document.

Assembly of a full Specifications Document occurs at user request. The Linking Software scans all drawings included in the Project, as identified by the user, detects and records all Drawing Entity tags and assembles a list of all Specifications Text Block links, listed hierarchically according to a preferred indexing convention. The complete Specifications Document is then saved to disk in a standard file format for subsequent printing by the user or electronic transmission to others involved in the Project.

An important benefit of the current invention is that with consistent use it allows effectively instantaneous, automated generation of all or part of the Project Specifications Documents, properly collated in Industry-standard format. Another benefit of the current invention is that the generated Specifications documents are reliable and accurate to the degree that information saved to the database is accurate, and are not susceptible to human error in either the authoring or collating phases of Specifications Document assembly.

In a preferred embodiment, Architectural Drawing Notes are tagged by the Linking Software as they are written or as they are included in the Drawing from storage on disk, being previously tagged before being stored. Each unique Drawing Note has a Specifications Text Block associated uniquely with it as assigned by the user and saved by the Linking Software. All Drawing Notes in all Drawings associated with a Project are tagged as the Drawings are created. The Linking Software includes a module that polls all Project Drawings to ensure that all Drawing Notes have been tagged and assigned links to Specifications Text Blocks before final output of the Specifications Document, prompting the user appropriately if this is not the case. The aggregate of all Drawing Notes in all Drawings associated with a Project gives a complete textual description of all materials, parts, and assemblies comprising the completed fabrication.

The tags, or links, contain an index which allows for the organization of the Specifications Text Blocks in a desired sequence. As an alternative the tags or links contain an instruction set which allows for the manipulation of the Specifications Text Blocks to produce a desired grouping of text. A preferred indexing system in an Architectural Design environment is known as 'MASTERSPEC'® and is published and maintained by the American Institute of Architects, the representative body for architectural professionals. Furthermore, Drawing Notes may be stored by the Linking Software for easy reuse or maintenance, with corollary benefits of time savings and increased accuracy. At the end of the Project and at the user's request, all Drawing Notes in all CADD Drawings identified by the user as comprising the Project are examined by the Linking Software and a list of links to associated Specifications Text Blocks is built, arranged hierarchically according to the MASTERSPEC numbering system. The Linking Software then assembles a complete Specifications Document by creating a new file and moving down the list one entry at a time and appending that entry's associated Specifications Text Block to the end of the new file until the list has been completed. The new file is then closed and named by the user. At this point the file, which represents the completed Specifications Document, is available to the user for printing or electronic transfer.

First Preferred Embodiment

Figure 3:
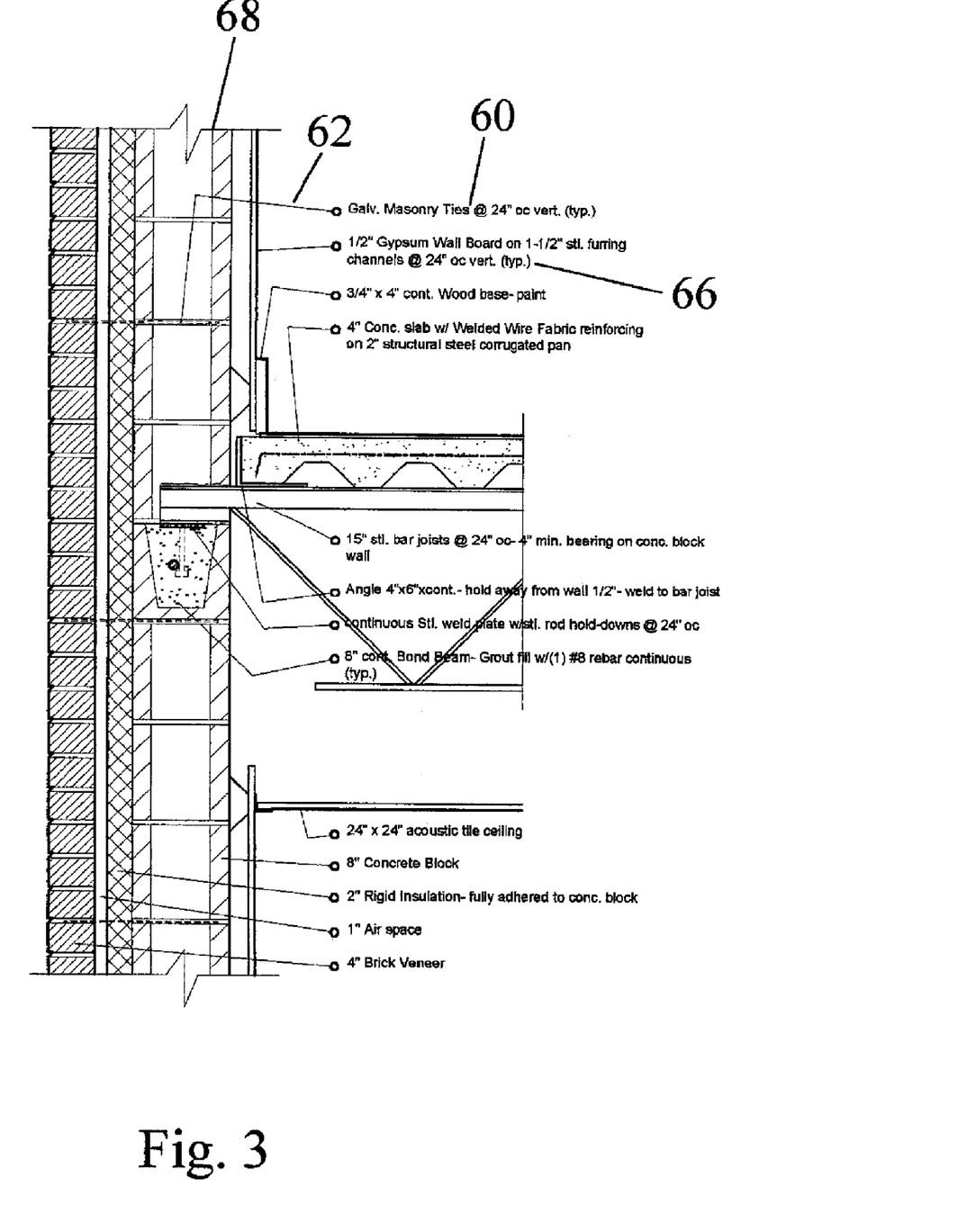
FIG. 3 depicts an exemplary drawing typical of those produced by use of a CADD system, containing Drawing Entities with which the current invention interacts.

Referring now to FIG. 3, which shows a detail drawing representative of the types of graphical drawings that in the aggregate comprise a Drawing, a number of which in turn comprise the graphical portion of a Project. The drawing of FIG. 3 contains a graphical depiction of a particular assembly 68, and a number of textual components, in this case, Drawing Notes. The upper-most Drawing Note 60 reads "Galv. Masonry Ties@ 24" o.c. vert. (typ)". A lead line 62 points to the area of the graphical depiction to which the Drawing Note refers. The next Drawing Note below Drawing Note 60 appears as Drawing Note 66, reading "½" gypsum Wall Board on 1½" stl. furring channels@ 24" o.c. vert. (typ.)".

In the prior art this graphical depiction was created by a CADD program, and the Drawing Notes are likewise contained within this same CADD program. Both the constituent parts of the graphical depiction, and the Drawing Notes are Drawing Entities in the prior art. Utilizing this same prior art, a set of Specifications were generated by specialists generally other than those creating the drawings, and who have had to refer to the combination of this graphical depiction and its explanatory Drawing Notes as a starting point. As previously mentioned, these Specifications are organized in sections, according to a code system known as MASTERSPEC. A page from the MASTERSPEC document which defines these codes is included herewith as Appendix A. Referring to Appendix A, it is seen that the code assigned in the MASTERSPEC format to designate Gypsum wall board (board assemblies) is 09260.

Figure 2:
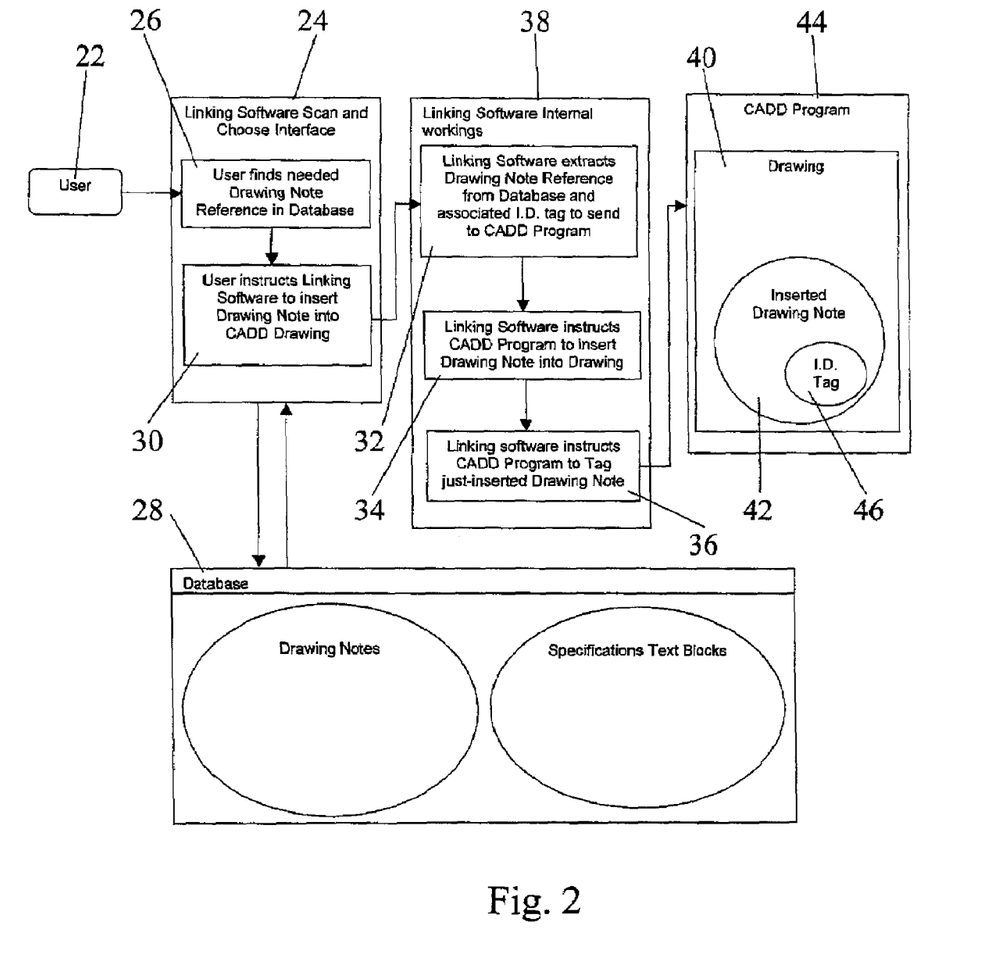
FIG. 2 depicts a block diagram of the invention.

According to the current invention, this code will be included as an index within the tag permanently assigned to a Drawing Note as assigned by the user, thereby establishing a logical link between the Drawing Note and its associated Specifications Text Block. Referring now to FIG. 2, the current invention contains a database 28 which is used to store the Drawing Notes and their attached tags, as well as the Specifications Text Blocks.

The user 22 in this figure is shown generating a new Drawing Note for use in a new Project. He may either create the Drawing Note himself, using the Linking Software, or he may use a scan 24 process which looks for identical Drawing Notes within the database. If it is found, 26, the user next inserts 30 the Drawing Note into the current Drawing, as part of the current Project. This is an iterative process, and continues throughout the drawing phase of the Project.

FIG. 2 also shows the internal workings 28 of the database program. When the database program extracts 32 the desired Drawing Note from the database, it also keeps the reference ID as a link to the Specifications Text Block, contained in a companion database. When the user places the Drawing Note just found into the current drawing 34, the reference ID is also maintained in the database of the current Project 36. In addition, this reference ID, or tag, 46, is also embedded into the current Drawing Note 42 data stored within the drawing 40 itself. The CADD program 44 contains its own CADD database wherein Drawing Notes are referenced and arranged to create a Drawing.

Figure 1:
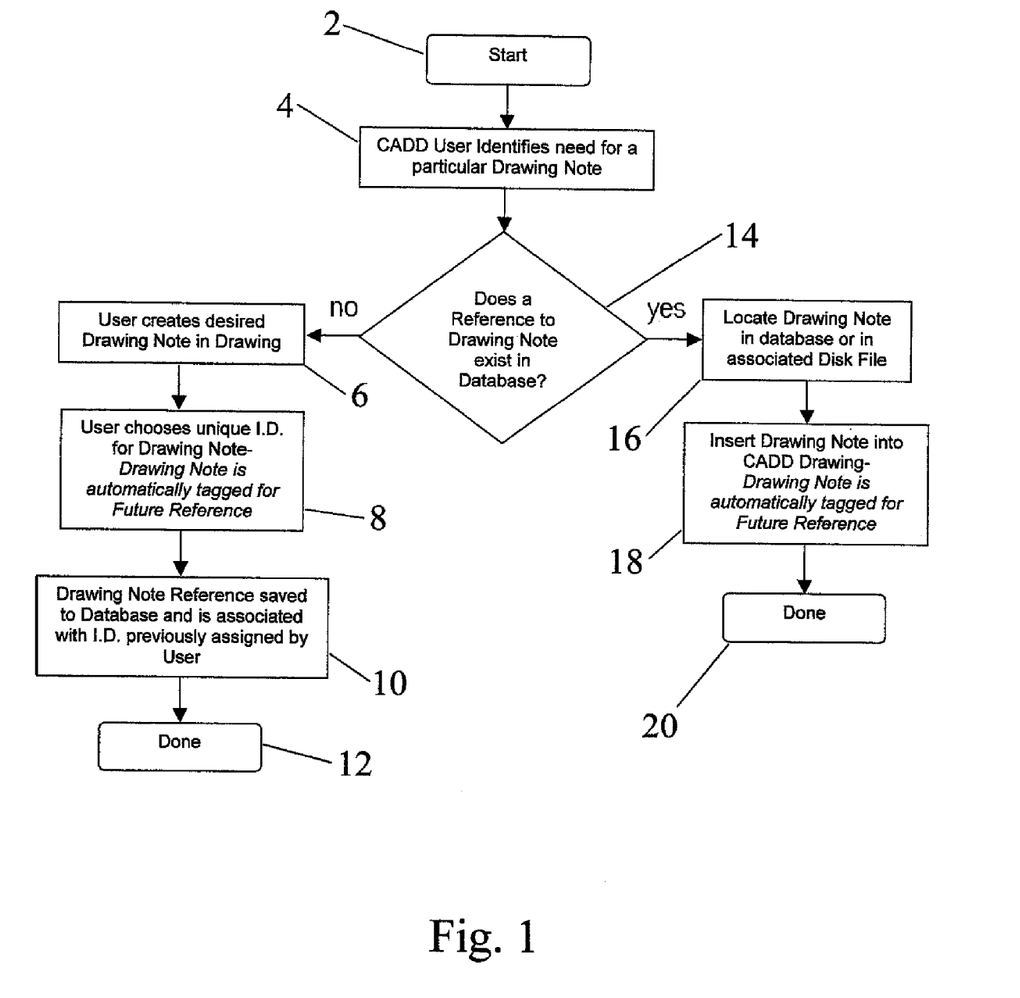
FIG. 1 depicts a flow chart showing the operation of the current invention.

Referring now to FIG. 1, the user starts 2 the design process by identifying 4 the need for a particular Drawing Note. The appropriate Drawing Note may be located by browsing the Legacy database, or may be created by the user using the Linking Software. The user will have the opportunity to examine the Drawing Note to insure it is the Drawing Note desired, before inserting it into the Drawing presently under development.

The user next will determine 14 whether the appropriate Drawing Note does, in fact, exist in the database, and if so, the Linking Software locates 16 the Drawing Note in the database. When the Drawing Note is located, it is inserted into the CADD drawing, together with the ID number from the database as a tag 18, or link.

If the desired Drawing Note does not exist, the user creates the Drawing Note 6. The user chooses a unique reference ID number 8 in MASTERSPEC format, and this reference ID number appears as part of a tag attached to the Drawing Note as it is created 10 in the CADD Drawing. In the current embodiment, the tag is invisible to the user, although it may be visible in other embodiments.

The process of searching for previously stored Drawing Notes in combination with the generation of new Drawing Notes as required is an iterative one, and it continues until the user is finished with the current drawing 12, 20.

Figure 4:
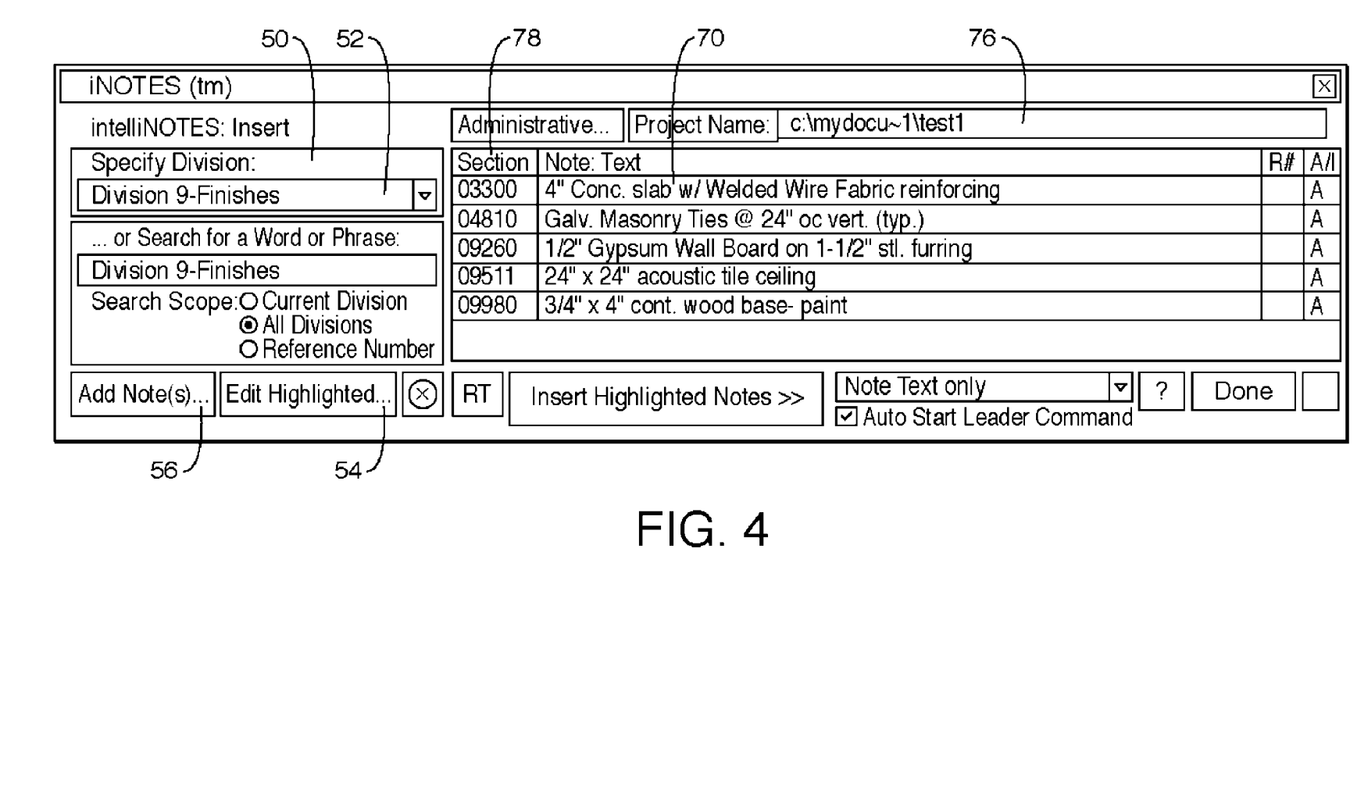
FIG. 4 depicts a window of a WINDOWS® implementation of the current invention, allowing for the complete management of a database of Drawing Notes, including commanding the creation/editing of Drawing Entities, more specifically Drawing Notes, and searching for, retrieval of, and insertion into a CADD Drawing of Drawing Notes.

Referring next to FIG. 4, a screen snapshot of the INSERT window shows how the Drawing Notes are entered into the CADD Drawing. The user first selects the Project by means of the button entitled "Project Name", located to the left of the project window 76. The Project is selected, and saved, using a file name reserved for this purpose.

The pull-down list 50 allows the user to select the Division of the MASTERSPEC ID number to be displayed (MASTERSPEC ID Codes are organized by Division and Section). As an alternative, the user may search 52 through the Drawing Notes database for a word or phrase contained within the Drawing Notes, or for a MASTERSPEC ID number. The corresponding Drawing Notes are displayed into the window in the center of the display, with the Section 78 of the MASTERSPEC ID number displayed as the first column, and the corresponding Drawing Note text 70 appearing as the next column to the right.

To edit an existing Drawing Note, the user selects the Drawing Note by clicking either the Section Number or the Text in the row in which the Drawing Note appears, causing the Drawing Note to be highlighted. The user next clicks the "Edit Highlighted . . . " button 54, which allows the user to change the contents of the Drawing Note by presenting the screen shown in FIG. 5.

Still referring to FIG. 4, to add a Drawing Note, the user clicks on the "Add Note(s)" button 56. A window appears in which a new Drawing Note and all associated information including the MASTERSPEC reference ID number may be generated. The window is described in greater detail below and is referenced as FIG. 5.

Figure 5:
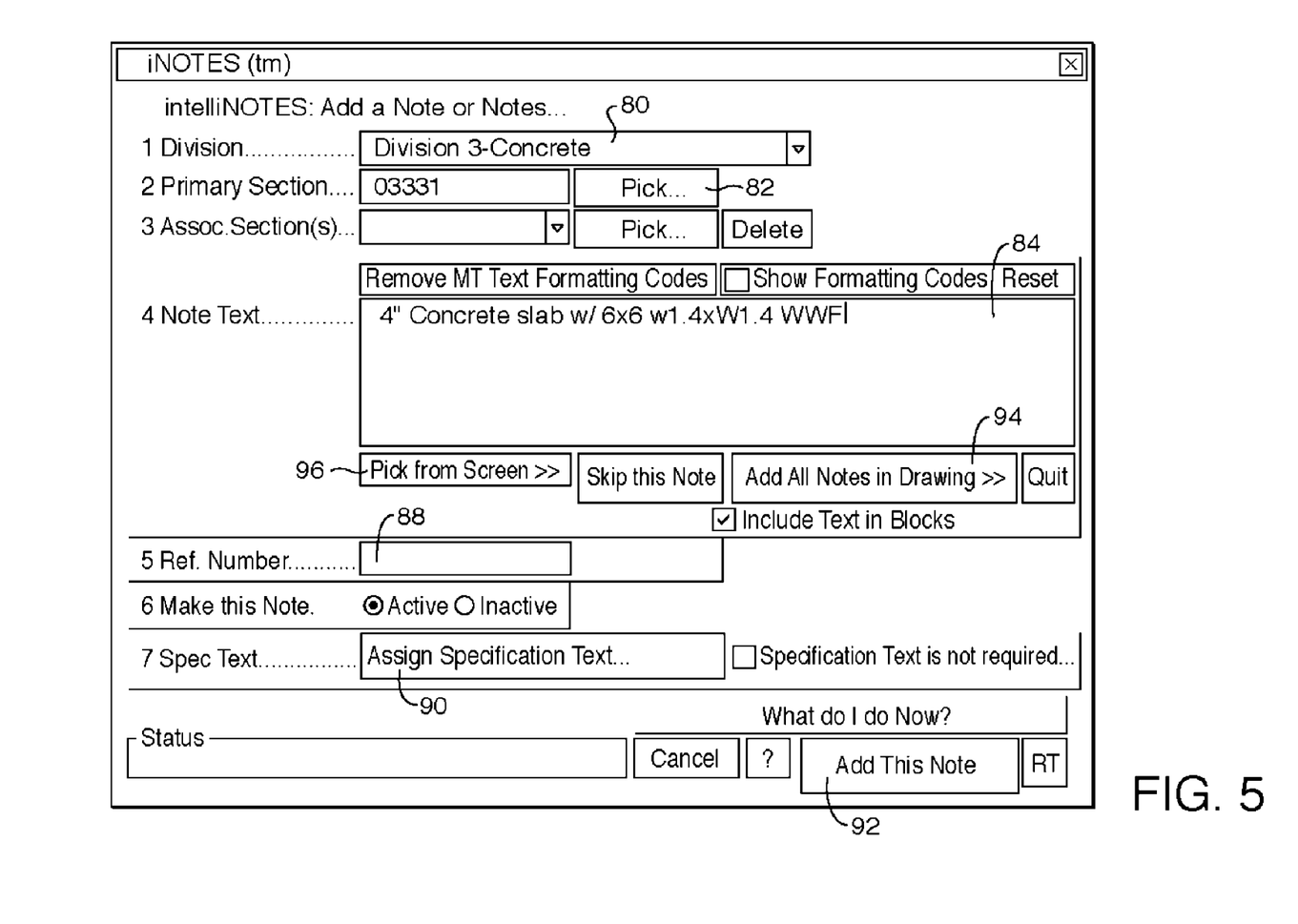
FIG. 5 depicts a window of a WINDOWS implementation of the current invention, providing for the editing of Drawing Notes, the insertion of reference IDs, and commanding the input of Specifications Text Blocks.

Referring now to FIG. 5, the pull-down list 80 lists all MASTERSPEC Divisions of the MASTERSPEC code of FIG. 4, and the MASTERSPEC Section numbers of FIG. 4 are displayed in a pull-down list below, together with a select (PICK) button 82, if a different Section number than that displayed needs to be selected. The text of the Drawing Note is displayed in the central window 84 of this display, where it may be created from scratch in this window which operates as a basic text processor. The Drawing Note text may alternatively be picked from the screen of the CADD program by clicking on the "Pick from Screen" button 96, which will import the text from the screen into the central window 84. As another alternative, the user may select "Add All Notes in Drawing" 94, which sequentially allows the user to add all the notes in the Drawing into the database.

The user may also assign an optional reference number to be displayed in the CADD Drawing along with the Drawing Note, as may be required by individual office standards, by typing in the 'Ref. Number' window 88. The "Assign Specification Text . . . " button 90 brings up the screen of FIG. 6, allowing the input of the Drawing Note. Once this Specifications Text Block is added, the Drawing Note, with an imbedded link to the Specifications Text Block in the form of the MASTERSPEC reference ID number, is added to the database by means of button 92.

Figure 6:
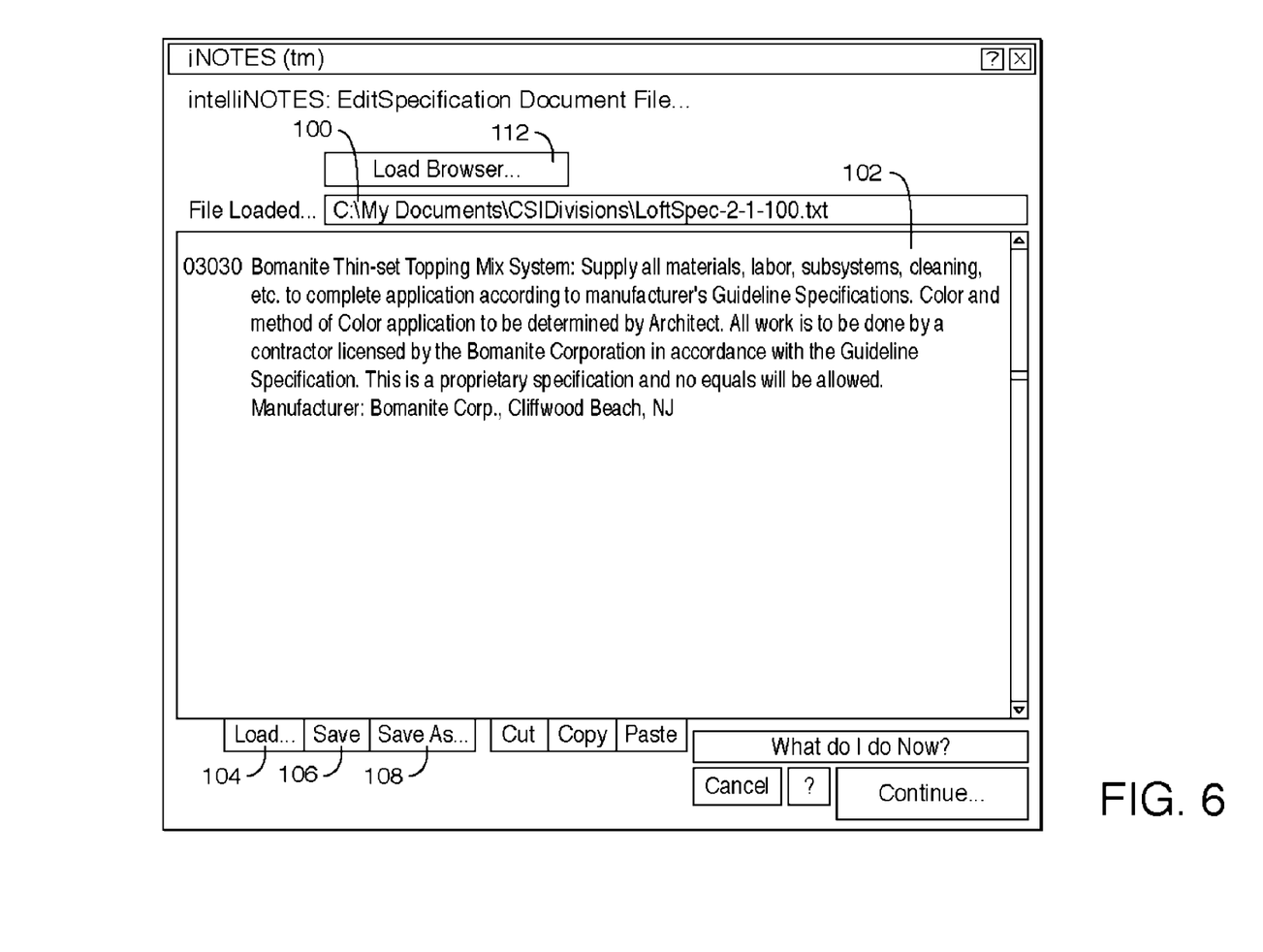
FIG. 6 depicts a window of a WINDOWS implementation of the current invention, providing for the creation and editing of Specification Text Blocks.

Referring now to FIG. 6, this figure shows the window produced when the user clicks the "Assign Specification Text . . . " button on the screen of FIG. 5. The screen of FIG. 6 has a central window 102 where individual Specifications Text Blocks are displayed. The Specifications Text Blocks are organized according to MASTERSPEC format, and the figure shows an entry belonging to the CONCRETE Division, Section 03030. Still referring to FIG. 6, the MASTERSPEC section number is displayed at the left of the window, and the text to the right. A Web Browser may be loaded by clicking on button 112, which allows for retrieval of Specifications Text Blocks from remote databases, including manufacturer's web sites, which typically include manufacturer's recommended Specifications text. The file path indicating where the completed Specifications Text Block will be saved appears in the window 100 beneath the button.

Editing is done with the assistance of a LOAD button 104, a SAVE button 106, a SAVE AS button 108, and CUT, COPY, and PASTE buttons. These buttons perform the same functions as in the usual WINDOWS®-based word processors, including MS WORD®.

Figure 7:
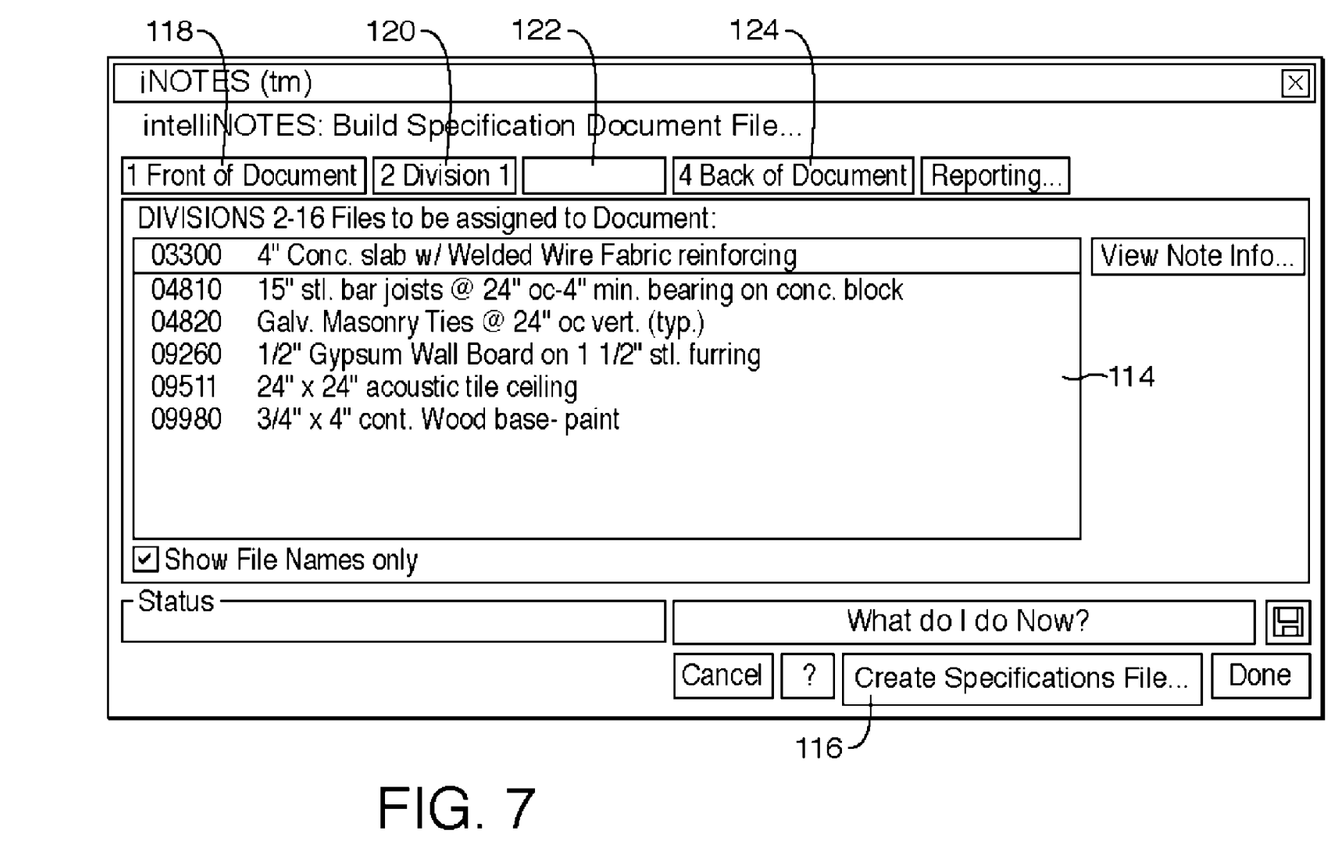
FIG. 7 depicts a window of a WINDOWS implementation of the current invention, providing for the assembly of all indicated Specification Text Blocks, as well as other documents such as contracts and other legal agreements, into a complete Specifications Document for a Project.

Referring now to FIG. 7, a window is generated displaying a hierarchical listing of all unique Drawing Notes, the organizing hierarchy being based on MASTERSPEC format, as discussed previously. When tab-button 122 is chosen, a central window 114 displays the MASTERSPEC section codes as compiled from the Project Drawings that will be output as the majority of the Specifications Document. Drawing Notes also appear in this window aligned with the associated MASTERSPEC Section number. At the top of this window there are other tab-button buttons 118, 120, 124 which allow the user to optionally append additional documents to the Specifications Document including legal documents such as Contracts and Insurance bonds, as may needed according to Industry type and individual office practice.

The implementation described above thus provides the user with a means to archive, maintain, and retrieve for reuse a library of Drawing Notes and Specifications Text Blocks, each such Drawing Note with a numbered link to a corresponding Specifications Text Block, also contained within the library. This library is in the form of a database accessible throughout the architectural firm. The link which associates the Drawing Notes and Specifications Text Blocks also provides a link into the aggregate of Drawing Entities known as a Drawing which is maintained by the CADD system. Thus, the library provides a database of re-usable Drawing Notes and Specifications Text Blocks.

As this system continues to be used, the database will expand until the vast majority of Drawing Notes and Specifications Text Blocks required by Architectural Projects will be available, thus eliminating the costly process of manually generating these text elements and links "from scratch" each time a new Drawing is begun.

This implementation may be embodied on a stand-alone computer. If may also be implemented on a computer network, including the INTERNET, thus making the system available to different offices within the same organization, and remotely located from each other.

The preferred embodiment in the present system uses the MASTERSPEC reference number system, which is one of the major such reference number system used in architecture today. Other embodiments replace the MASTERSPEC system with other predominant Building-industry related reference systems, which include the systems known as MASTERFORMAT, and UNIFORMAT. The MASTERFORMAT system is described in detail in the document *Masterformat* 2004 published by The Construction Specifications Institute, 99 Canal Center Plaza, Suite 300, Alexandria Va. 22314. The UNIFORMAT system is described in the document *E1557-05 Standard Classification for Building Elements and Related Sitework-UNIFORMAT II*, published by, ASTM International, 100 Barr Harbor Drive, PO Box C700, West Conshohocken, Pa. Both of these documents are incorporated herein by reference in their entirety, in order to describe the identification systems used as alternatives to the MASTERSPEC system, as defined in the present application.

While the invention has been described with reference to specific embodiments, it will be apparent that improvements and modifications may be made within the purview of the invention without departing from the scope of the invention defined in the appended claims.

What is claimed is:

1. A computer-software-based method for generating and maintaining Project textual documentation comprising the software-implemented steps of (a) in a first project, appending information to discrete electronically generated Drawing Entities for purposes of establishing an electronic link between said Drawing Entities and text, the method further comprising the steps of:
   (i) identifying a Drawing Entity contained in a CADD file;
   (ii) identifying a grouping of text in a text block file;
   (iii) creating Linking Information between said Drawing Entity and said text;

(iv) associating said linking information with the corresponding Drawing Entity;
(v) storing each Drawing Entity together with the associated linking information;
(vi) scanning one or more additional CADD files, each containing one or more new Drawing Entities, and for each new CADD file:
(vii) repeating steps (i) through (v) for all of the new Drawing Entities;
(b) repeating steps (i) through (vii) for Drawing Entities not yet linked to text in a next project, and
(c) Generating one or more Project Specifications Document files comprising all the text associated with said Drawing Entities.

2. The method of claim 1, wherein the text block file further comprises one or more word processor files.

3. The method of claim 1, wherein the text block file further comprises one or more database files.

4. The method of claim 1, wherein the text block file further comprises one or more spreadsheet files.

5. The method of claim 1, wherein the text block file further comprises one or more electronic means of storing an aggregate of discreet groupings of text.

6. The method of claim 1, wherein a Project Database is created from reuse of the stored Drawing Entities, corresponding text, and associated linking information combined with all of the Drawing Entities, corresponding text, and associated linking information of the next project.

7. The method of claims 2 or 3 or 4 or 5, or 1, or 6 in a next project, further comprising searching the Project Database for text blocks linked to each Drawing Entity identified, and, if present, using said links in said next project.

8. The method of claim 6, wherein the Project Database comprises a centralized data storage format.

9. The method of claim 6, wherein the Project Database comprises a distributed data storage format.

10. The method of claim 1 wherein the outputting Project Specifications Document further comprises printing.

11. The method of claim 1 wherein the outputting Project Specifications Document further comprises electronic publishing.

12. The method of claim 1, wherein the Project Specifications Document is related to the field of Industrial Design.

13. The method of claim 1, wherein the Project Specifications Document is related to the field of Interior Design.

14. The method of claim 1, wherein the Project Specifications Document is related to the field of Engineering Design.

15. The method of claim 1, wherein the Project Specifications Document is related to the field of Architectural Design.

16. The method of claim 15, wherein the Project Specifications Document is comprised of architectural documentation, which further comprises standardized indexing and numbering reference systems.

17. The method of claim 1, wherein the method is effected by stand-alone computers.

18. The method of claim 1, wherein the method is effected by computer networks.

19. The method of claim 1, wherein the method is effected by remote data communications networks.

20. The method of claim 1, wherein Linking Information between said Drawing Entity and said text further comprises data input from pre-existing sources.

21. The method of claim 1, wherein the grouping of text further comprises an aggregate of groupings of text from one or more pre-existing sources.

* * * * *